United States Patent [19]

Beurrier

[11] 3,815,049

[45] June 4, 1974

[54] NEGATIVE RESISTANCE OSCILLATOR WITH ACTIVE BIAS RESISTOR FOR PREVENTING SPURIOUS OSCILLATIONS

[75] Inventor: Henry Richard Beurrier, Chester Township, Morris County, N.J.

[73] Assignee: Bell Telephone Laboratories, Incorporated, Murray Hill, N.J.

[22] Filed: Apr. 9, 1973

[21] Appl. No.: 349,395

[52] U.S. Cl. .............. 331/107 R, 307/253, 307/318, 331/185

[51] Int. Cl. .............................................. H03b 7/06

[58] Field of Search .................... 307/253, 318, 237; 333/80 T; 338/22 SD; 331/107 R, 107 G, 107 T, 115, 185, 186

[56] References Cited

UNITED STATES PATENTS 3,218,573 11/1965 Van Kessel.................. 331/107 T X

*Primary Examiner*—Herman Karl Saalbach
*Assistant Examiner*—Siegfried H. Grimm
*Attorney, Agent, or Firm*—Sylvan Sherman

[57] ABSTRACT

This application describes an active resistor which presents a high resistance, ΔE/ΔI, to alternating current signals while presenting a much lower resistance, E/I, to direct current. The resistor is a two-terminal device including a transistor whose emitter is connected to one terminal and whose collector is connected to the other terminal. A parallel conductive path, to which the transistor base is connected, includes means for maintaining a controlled emitter-base bias. The device is specifically intended for use in IMPATT diode bias circuits.

10 Claims, 8 Drawing Figures

NEGATIVE RESISTANCE OSCILLATOR WITH ACTIVE BIAS RESISTOR FOR PREVENTING SPURIOUS OSCILLATIONS

This invention relates to active resistors having a high resistance to alternating current and a much lower resistance to direct current.

BACKGROUND OF THE INVENTION

In U.S. Pat. No. 3,621,463 and, more recently, in the copending applications of C. A. Brackett, Ser. No. 304,629, filed Nov. 8, 1972, and of H. Seidel, Ser. No. 317,620, filed Dec. 22, 1972, both assigned to applicant's assignee, the problem of spurious oscillations in diode oscillators is discussed. In particular, it is noted that many negative resistance diodes, such as IMPATTS, often burn out when operated at only moderate power levels. This, it is found, is due to the tendency of the direct current bias circuit to break into spurious oscillations. Indeed, it is observed that the diode presents a negative resistance to the bias circuit over a range of frequencies that extends from zero frequency well into the microwave range of frequencies. So long as the positive resistance of the bias circuit is greater than the magnitude of the diode negative resistance, oscillations are suppressed. However, since both these resistances tend to vary considerably over the frequency spectrum, there are regions within which the positive loading is insufficient, and spurious oscillations can and do occur.

While it is always possible to include enough positive resistance in the bias circuit to insure that spurious oscillations are suppressed over the entire frequency spectrum, the inclusion of such a large resistance results in a substantial d.c. power loss which, for many practical applications, is unacceptable. What is specifically required in the bias circuit of an IMPATT oscillator is a network that has a relatively low resistance to direct current, and a relatively high resistance to alternating current.

SUMMARY OF THE INVENTION

The desired resistance characteristic is obtained, in accordance with the present invention, by means of a two-terminal transistor circuit termed an "active resistor", wherein the transistor collector is connected to one terminal, and the transistor emitter is connected to the second device terminal through a series resistor.

A parallel conductive path, to which the transistor base is connected, includes means for maintaining a controlled emitter-base bias.

In one embodiment of the invention, the parallel conductive path comprises a d.c. voltage source connected between the second terminal and the transistor base, and a resistor connected between the transistor base and the one terminal.

In a second embodiment of the invention, a constant voltage diode is connected between the second terminal and the transistor base, instead of a voltage source.

In a third embodiment of the invention, the parallel path includes a resistor connected between the second terminal and the transistor base, and a constant current diode connected between the transistor base and the one terminal.

The principal advantage of the present invention over the prior art is its simplicity.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
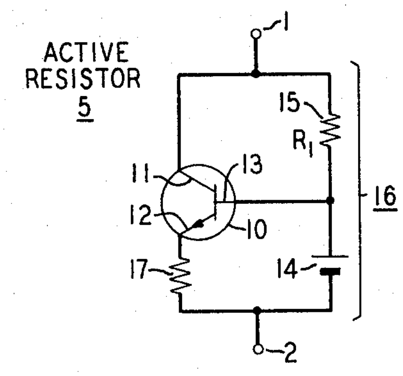
FIG. 1 shows a first embodiment of an active resistor in accordance with the present invention.

Referring to the drawings, FIG. 1 shows a first embodiment of an active resistor 5 in accordance with the present invention. The resistor is a two-terminal device including a transistor 10 whose collector 11 is connected to one of the terminals 1, and whose emitter 12 is connected to the second device terminal 2 by means of a series resistor 17. A constant d.c. voltage source, such as a battery 14, connected between terminal 2 and base 13, and a resistor 15 connected between the base and terminal 1, form a parallel conductive path 16 between terminals 1 and 2.

Figure 2:
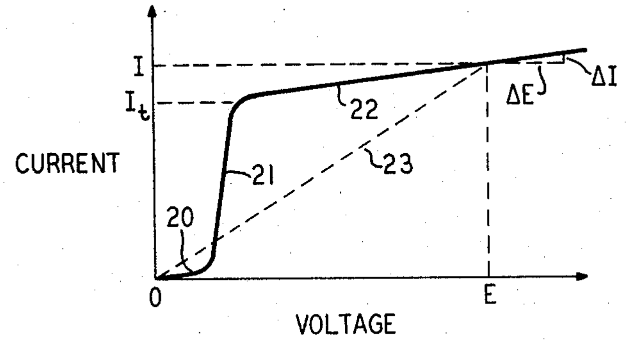
FIG. 2, included for purposes of explanation, shows the current-voltage characteristic of the active resistor shown in FIG. 1.

For the n-p-n type transistor illustrated, battery 14 impresses a small positive voltage on base 13, thus forward biasing transistor 10. However, in the absence of any voltage across terminals 1 and 2, no emitter-collector current flows through transistor 10, and substantially no current flows through resistor 15. With the application of a small positive voltage of less than the collector-emitter saturation voltage between terminals 1 and 2, current starts to flow through resistor 15. However, no significant current flows through transistor 10. The current-voltage (I-V) characteristic of resistor 5 over this range of applied voltages is given by curve portion 20 in FIG. 2. As the terminal voltage increases, transistor 10 starts to conduct more heavily, reaching a maximum current $I_t$ which is a function of the emitter-base bias voltage and the magnitude of resistor 17. Curve portion 21 in FIG. 2 illustrates this region of the $I-V$ characteristic of resistor 5. With the emitter-base voltage substantially constant, a further increase in terminal voltage produces substantially no change in transistor current. However, the current through parallel path 16 increases, as illustrated by curve portion 22 in FIG. 2.

It will be noted from FIG. 2 that at a point (E, I) along curve portion 22, the resistance of resistor 5 to direct current, given by E/I, is equal to the reciprocal of the slope of a line 23 from the origin to point (E, I). By contrast, the resistance to an alternating current signal, given by $\Delta E/\Delta I$, is equal to the reciprocal of the slope of the tangent to curve portion 22 at point (E, I). As is apparent, the latter, which is approximately equal to the magnitude $R_1$ of resistor 15, is substantially larger than the d.c. resistance as given by E/I.

In the explanation given hereinabove, the emitter-base voltage was characterized as being "substantially" constant. As a practical matter, however, this voltage will tend to increase as a result of two effects. The first of these is a thermal effect. As transistor 10 heats up, the emitter-base band-gap potential, which is a counter voltage effectively in series with the externally applied bias from source 14, is reduced. The second effect involves the terminal voltage of source 14 which, due to a finite internal impedance, tends to rise as more current is forced through the source as the voltage applied across terminals 1 and 2 is increased. Both of these inherent effects and, in particular, the former would cause the transistor current to increase greatly in the absence of an adequate, current control mechanism. For example, some sort of thermal stabilization can be provided for transistor 10, and voltage regulating means can be provided for source 14. Alternatively, a degree of negative current feedback can be provided in the transistor circuit, as in FIG. 1, wherein a resistor 17 is included between terminal 2 and emitter 12. In operation, the transistor current flowing through resistor 17 develops a counter voltage which reduces the net emitter-base bias. Any tendency for the latter to increase due to either of the above-described effects, increases this counter voltage and, thereby, tends to stabilize the transistor current. The degree of control provided by resistor 17 is a function of its magnitude, as will be indicated more specifically hereinbelow. Advantageously, the magnitude of resistor 17 is large enough so that neither of the above-described effects produces any appreciable change in the net transistor current.

Figure 3:
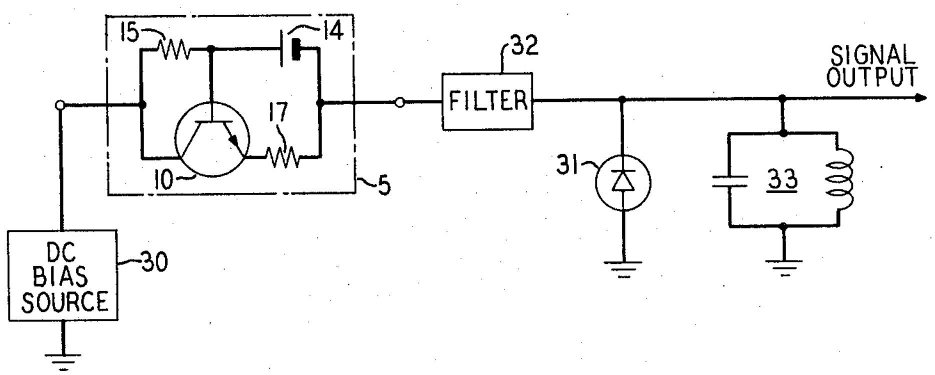
FIG. 3 shows the use of the active resistor of FIG. 1 in the bias circuit of a diode oscillator.

FIG. 3 illustrates the use of active resistor 5 in the bias circuit of a negative resistance diode oscillator. Typically, the negative resistance diode 31, such as an IMPATT diode, is connected to a direct current bias source 30 and to a resonant circuit 33. A band-rejection filter 32, tuned to the output signal frequency of interest, is typically included in the bias circuit between source 30 and diode 31. While filter 32 prevents spurious oscillations in the bias circuit within the band of interest, it does not prevent the spurious oscillations outside the band of interest that have been responsible for diode burnout. The suppression of these out-of-band oscillations is effected by active resistor 5 which, as explained hereinabove, presents a relatively small series resistance to the d.c. bias current while presenting a much higher positive resistance to alternating currents. Since the latter resistance is primarily that of a simple resistor 15, the bandwidth of the circuit is limited essentially by the collector-base capacitance of transistor 10.

In the embodiment of FIG. 1, a battery is used to maintain a substantially constant bias between the emitter and the base of transistor 10. In the second embodiment of the invention illustrated in FIG. 4, the battery is replaced by a zener diode 40. While there are some difference in the low voltage characteristics of this embodiment, its behavior at the higher voltages of interest is essentially the same as described hereinabove.

Once the voltage across terminals 1 and 2 is high enough to fire the zener diode and cause transistor 10 to conduct fully at its designed d.c. current, the $I-V$ characteristic assumes the flat shape of curve portion 22, thereby yielding the desired low d.c. resistance and high a.c. resistance.

Figure 5:
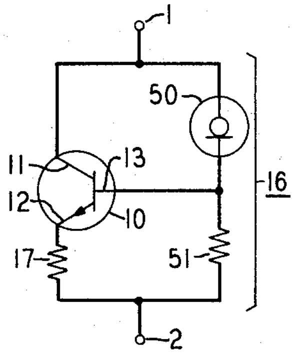

FIG. 5 shows a third embodiment of the invention wherein the parallel conductance path 16 to which the base is connected comprises a constant current diode 50, such as Motorola types IN5284 to IN5291, connected between terminal 1 and base 13, and a resistor 51 connected between base 13 and terminal 2. Diode 50 is essentially the dual of zener diode 40 in that the former is characterized by a constant current whereas the latter is characterized by a constant voltage. Thus, in operation, the current through resistor 51 remains substantially constant as the voltage applied between terminals 1 and 2 is varied. This, in turn, maintains a substantially constant voltage between terminal 2 and the base of transistor 10, resulting in a very high a.c. resistance between terminals 1 and 2.

In each of the above-described embodiments, some means is provided in parallel conductive path 16 for producing what has been characterized as a "substantially" constant voltage between resistor terminal 2 and the transistor base 13. However, as noted above, any constant voltage source has a finite internal impedance and, hence, its terminal voltage will tend to change with changes in current. Thus, the voltage between terminal 2 and base 13 will tend to change as a function of current as the voltage applied to resistor 5 is varied. Similarly, the voltage across a zener diode, and the current through a constant current diode are not absolutely constant. Thus, as used herein, the term "substantially" constant shall be understood to mean constant within the inherent capabilities of the means employed.

Figure 6:
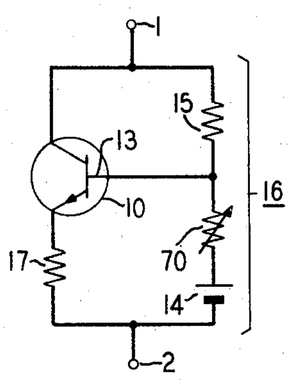
FIGS. 6 and 7 illustrate means for controlling the magnitude of the a.c. resistance of an active resistor in accordance with the present invention.

Thus far we have considered cases wherein the voltage between terminal 2 and base 13 is maintained substantially constant. However, it may well be that the a.c. resistance thus produced is too high for some particular application. To reduce, or more generally control the magnitude of the a.c. resistance, one may wish to introduce some controlled variation in the base-terminal voltage. This can be accomplished by the inclusion of an added resistor 70 between the base 13 and terminal 2, as illustrated in FIG. 6. The effect upon the a.c. resistance, Z, of resistor 5 can be easily seen from the expression $$Z = (R_1 + R_2)\ (R_3/R_3 + R_2) \qquad (1)$$

which gives the magnitude of the a.c. resistance between terminals 1 and 2 in terms of the magnitudes $R_1$, $R_2$ and $R_3$ of resistors 15, 70 and 17, respectively.

For example, when $R_2 = 0$, as in the embodiment of FIG. 1, $Z = R_1$. For the case of $R_2 = R_3$, $Z = R_1 + R_3/2$. Noting that $R_3$ is typically much less than $R_1$, the a.c. resistance in this latter case is reduced by approximately one-half. Thus, by the inclusion of some means for varying the voltage between terminal 2 and base 13, in response to changes in the voltage applied between terminals 1 and 2, the magnitude of the a.c. resistance of active resistor 5 can be controlled.

Figure 4:
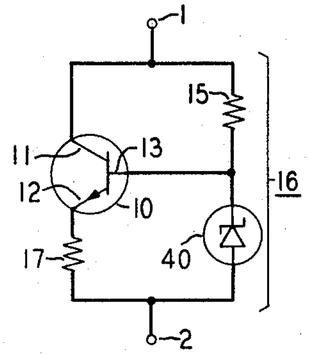
FIGS. 4, 5 and 8 show other embodiments of an active resistor in accordance with the present invention.

In a similar fashion, the inclusion of a resistor between base 13 and terminal 2 in the embodiment of FIG. 4 provides a means for lowering the a.c. resistance of that embodiment of active resistor 5.

Figure 7:
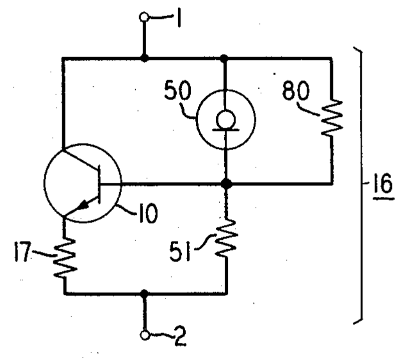

To reduce the a.c. resistance of the embodiment of FIG. 5, a resistor 80 is placed in shunt with constant current diode 50, as shown in FIG. 7.

EXAMPLE

As an illustrative example, consider the embodiment of FIG. 6 wherein:

$R_1$ = 3,300 ohms
$R_2$ = 330 ohms
$R_3$ = 22 ohms
and the required direct current, $I_{dc}$ is approximately 200 ma.

From equation(1) we obtain an a.c. resistance of Z = 226 ohms.

Using a 3.5 volt battery, and assuming a 0.6 volt band-gap potential for the transistor, the transistor current is 200 ma., and the parallel path current is 4.5 ma. for a total current of 205 ma. and a total d.c. voltage between terminals 1 and 2 of 15 volts. The d.c. resistance is therefore, 15/0.205 = 75 ohms.

Figure 8:
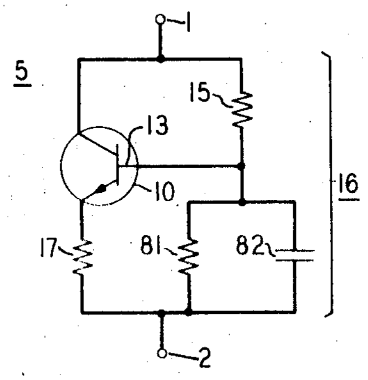

FIG. 8 shows an embodiment of the invention wherein a capacitor 82 in parallel with all or part of a resistor 81 is used to maintain a constant voltage between base 13 and device terminal 2. At the higher frequencies, at which the reactance of capacitor 82 is very much less than the resistance of resistor 81, the device operates as explained hereinabove. As the frequency decreases, the equivalent resistance between base 13 and terminal 2 increases, thereby decreasing the a.c. resistance of resistor 5. Thus, if the embodiment of FIG. 8 is used in the bias circuit of an IMPATT oscillator, as shown in FIG. 3, it would then be necessary to rely upon the internal resistance of the direct current bias source 30 to suppress spurious oscillations at the lower frequencies below which the a.c. resistance of resistor 5 is insufficient. However, this embodiment of an active resistor has the advantage of not requiring a battery or diodes.

It will be recognized that the use of an n-p-n transistor, and the particular means depicted in FIGS. 1, 4, 5 and 8 for obtaining a substantially constant voltage in parallel path 16, are merely illustrative. Other types of transistors, and other constant voltage means can just as readily be employed to practice the invention. Thus, in all cases it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. An oscillator comprising:
a negative resistance device;
a direct current source;
and a two-terminal active resistor connected in series between said negative resistance device and said direct current source;
said active resistor comprising:

a transistor whose collector electrode is coupled to one of said terminals and whose emitter electrode is coupled to the other of said terminals;
a parallel conductive path connected between said terminals;
said parallel path including therein means for producing a substantially constant voltage within the portion of said path included between said base electrode and the other of said terminals;
and means for coupling the base electrode of said transistor to said path.

2. The oscillator in accordance with claim 1 wherein:

said emitter electrode is coupled to said other terminal through a series resistor.

3. The oscillator in accordance with claim 1 wherein said parallel conductive path comprises:
a resistor connected between said base electrode and said one terminal;
and a direct current voltage source connected between said base electrode and said other terminal.

4. The oscillator in accordance with claim 3 wherein a resistor is included in series with said voltage source between said base electrode and said other terminal.

5. The oscillator in accordance with claim 1 wherein said parallel conductive path comprises:
a resistor connected between said base electrode and said one terminal;
and a zener diode connected between said base electrode and said other terminal.

6. The oscillator in accordance with claim 5 wherein a resistor is included in series with said zener diode between said base electrode and said other terminal.

7. The oscillator in accordance with claim 1 wherein said parallel conductive path comprises:
a constant current device connected between said base electrode and said one terminal;
and a resistor connected between said base electrode and said other terminal.

8. The oscillator in accordance with claim 7 wherein a resistor is connected in parallel with said constant current device.

9. The oscillator in accordance with claim 1 wherein said parallel conductive path comprises:
a resistor connected between said base electrode and said one terminal;
and the parallel combination of a resistor and capacitor connected between said base electrode and said other terminal.

10. An oscillator in accordance with claim 1 wherein:

said negative resistance device is an IMPATT diode.

* * * * *